United States Patent
Shih et al.

(10) Patent No.: US 11,856,862 B2
(45) Date of Patent: *Dec. 26, 2023

(54) FATIGUE-FREE BIPOLAR LOOP TREATMENT TO REDUCE IMPRINT EFFECT IN PIEZOELECTRIC DEVICE

(71) Applicant: Taiwan Semiconductor Manufacturing Company, Ltd., Hsin-Chu (TW)

(72) Inventors: Chi-Yuan Shih, Hsinchu (TW); Shih-Fen Huang, Jhubei (TW); You-Ru Lin, New Taipei (TW); Yan-Jie Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/874,446

(22) Filed: Jul. 27, 2022

(65) Prior Publication Data

US 2022/0367564 A1 Nov. 17, 2022

Related U.S. Application Data

(63) Continuation of application No. 16/534,330, filed on Aug. 7, 2019, now Pat. No. 11,456,330.

(51) Int. Cl.
*H10N 39/00* (2023.01)
*H10N 30/074* (2023.01)
*H10N 30/20* (2023.01)

(52) U.S. Cl.
CPC .......... *H10N 39/00* (2023.02); *H10N 30/074* (2023.02); *H10N 30/206* (2023.02)

(58) Field of Classification Search
None
See application file for complete search history.

(56) References Cited

U.S. PATENT DOCUMENTS 11,456,330 B2 * 9/2022 Shih ................. H10N 39/00
2008/0098582 A1 5/2008 Ohnishi et al.
(Continued)

OTHER PUBLICATIONS

Lee et al. "Imprint Characteristics of Pt/Pb(Zr, Ti)O3/Ir Capacitors." Metals and Materials International, vol. 12, No. 1 (2006), pp. 85-93.
(Continued)

*Primary Examiner* — Benjamin P Sandvik
(74) *Attorney, Agent, or Firm* — Eschweiler & Potashnik, LLC

(57) ABSTRACT

In some embodiments, the present disclosure relates to a method in which a first set of one or more voltage pulses is applied to a piezoelectric device over a first time period. During the first time period, the method determines whether a performance parameter of the piezoelectric device has a first value that deviates from a reference value by more than a predetermined value. Based on whether the first value deviates from the reference value by more than the predetermined value, the method selectively applies a second set of one or more voltage pulses to the piezoelectric device over a second time period. The second time period is after the first time period and the second set of one or more voltage pulses differs in magnitude and/or polarity from the first set of one or more voltage pulses.

20 Claims, 6 Drawing Sheets

(56) References Cited

U.S. PATENT DOCUMENTS

2011/0292107 A1    12/2011  Yamashita
2016/0082720 A1     3/2016  Ready et al.
2018/0316285 A1*  11/2018  Marth ................. H10N 30/802
2020/0098969 A1     3/2020  Kalnitsky et al.

OTHER PUBLICATIONS

Wikipedia.org. "Coercivity." Published on Feb. 1, 2019.
Whatmore, Roger. "Ferroelectric Materials." Springer Handbook of Electronic and Photonic Materials, published in 2018.
Wikipedia.org. "Permittivity." Published on Mar. 14, 2019.
Wikipedia.org. "Piezoelectric Coefficient." Published on Jan. 1, 2019.
Guo et al. "Measurements of Piezoelectric Coefficient d33 of Lead Zirconate Titanate Thin Films Using a Mini Force Hammer." Journal of Vibration and Acoustics, vol. 135, Feb. 2013.
Notice of Allowance dated May 13, 2022 for U.S. Appl. No. 16/534,330.

* cited by examiner

FATIGUE-FREE BIPOLAR LOOP TREATMENT TO REDUCE IMPRINT EFFECT IN PIEZOELECTRIC DEVICE

REFERENCE TO RELATED APPLICATION

This Application is a Continuation of U.S. application Ser. No. 16/534,330, filed on Aug. 7, 2019, the contents of which are hereby incorporated by reference in their entirety.

BACKGROUND

Piezoelectric devices (e.g., piezoelectric actuators, piezoelectric sensors, etc.) are used in many modern day electronic devices (e.g., automotive sensors/actuators, aerospace sensors/actuators, etc.). One example of a piezoelectric device is a piezoelectric actuator. A piezoelectric actuator can be utilized to create a physical movement that exerts a force on a physical part in a system under the control of an electrical signal. The physical movement generated by the piezoelectric actuator can be utilized to control various kinds of systems (e.g., mechanical systems, optical systems, etc.).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
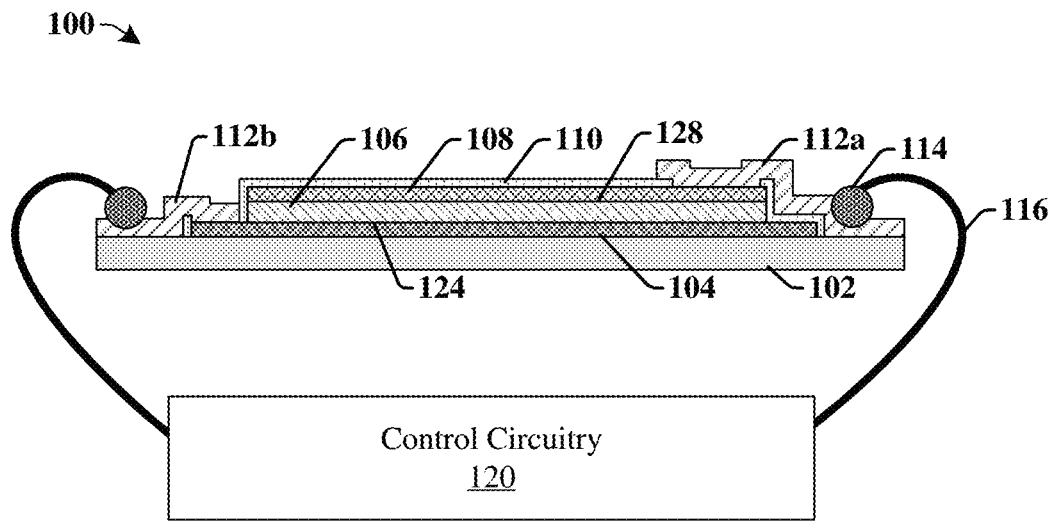
FIG. 1 illustrates a cross-sectional view of some embodiments of a piezoelectric device coupled to control circuitry.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A piezoelectric metal-insulator-metal (MIM) device includes a piezoelectric layer arranged between top and bottom electrodes. When a sufficient voltage bias is applied across the top and bottom electrodes, a mechanical strain may be induced in the piezoelectric layer. The mechanical strain may, for example, be used in acoustical, mechanical, and/or optical applications. The change in the structure of the piezoelectric layer may affect other electronic properties in the piezoelectric layer such as permittivity, capacitance, polarization, etc.

Over time, as voltage pulses are applied across the piezoelectric layer during a performance mode of the device, electrical charges may accumulate at an interface between the piezoelectric layer and the top or bottom electrode. The electrical charge accumulation, also known as an imprint effect (e.g., static imprint or dynamic imprint), may degrade device performance of the piezoelectric MIM device. Static imprint may occur after a voltage bias pulse is applied to the piezoelectric MIM device, and then the piezoelectric MIM device is stored for a long period of time. Dynamic imprint may occur after consecutive unipolar bias pulses are applied to the piezoelectric MIM device. For example, if the imprint effect (e.g., static imprint or dynamic imprint) occurs in a piezoelectric MIM device, properties such as the permittivity, capacitance, polarization and/or piezoelectric coefficient, for example, of the piezoelectric layer may significantly change when no voltage bias is applied to the piezoelectric MIM device, thereby degrading the piezoelectric MIM device performance. Thus, degradation of electrical or mechanical properties such as permittivity, capacitance, polarization, piezoelectric coefficient, or the like may be used to quantify a degree of imprint of a piezoelectric MIM device.

Various embodiments of the present disclosure provide a method for recovering or preventing a degraded piezoelectric MIM device. In some embodiments, over a first time period, a piezoelectric device may be operated in a performance mode, which may comprise the application of one or more voltage biases and/or storage of the piezoelectric device. A recovery operation comprising a bipolar loop, may be performed after a performance parameter of the piezoelectric device has reached a predetermined threshold value. The predetermined threshold value may indicate that the imprint effect has occurred in the piezoelectric device, or that the imprint effect is about to occur in the piezoelectric device.

Upon detection of the predetermined threshold value, one or more cycles of the bipolar loop may be conducted to recover the degraded piezoelectric device. The bipolar loop may comprise the application of a voltage bias at a first amplitude having a first polarity. The voltage bias is then adjusted to a second amplitude having a second polarity opposite to the first polarity, wherein a magnitude of the first amplitude is equal to a magnitude of the second amplitude. The voltage bias may then be adjusted to a third amplitude equal to zero. The magnitude of the first amplitude, in some embodiments, is less than or equal to an electric coercive field voltage of the piezoelectric device prior to degradation. By applying the bipolar loop to the piezoelectric device, charge accumulation at an interface between the piezoelectric layer and the top or bottom electrode may be reduced, and degraded properties of the piezoelectric device caused by an imprint effect (e.g., static imprint or dynamic imprint) may be recovered. Because the voltage biases of the bipolar loop have amplitudes less than or equal to the electric coercive field voltage of the piezoelectric device, the structure of the piezoelectric device does not experience fatigue. Thus, the bipolar loop may restore or improve reliability of the piezoelectric device performance without degrading the mechanical structure of the piezoelectric device through fatigue.

FIG. 1 illustrates a cross-sectional view 100 of some embodiments of a piezoelectric device coupled to control circuitry.

The piezoelectric device in cross-sectional view 100 may comprise, in some embodiments, a bottom electrode 104 over a substrate 102. A piezoelectric layer 106 may be arranged over the bottom electrode 104 and beneath a top electrode 108. In some embodiments, a passivation layer 110 may be arranged over a top surface of the top electrode 108 and cover outer sidewalls of the top electrode 108, the piezoelectric layer 106, and the bottom electrode 104. In some embodiments, the bottom electrode 104 may be wider than the piezoelectric layer 106 and the top electrode 108, and the piezoelectric layer 106 and the top electrode 108 may have outermost sidewalls that are substantially aligned with one another. A first metal pad 112a may be arranged over the top electrode 108 and extend through the passivation layer 110 to directly contact the top electrode 108. The first metal pad 112a is spaced apart from the piezoelectric layer 106 and the bottom electrode 104 by the passivation layer 110. In some embodiments, the first metal pad 112a is also over the substrate 102. A second metal pad 112b may be arranged over the bottom electrode 104 and extend through the passivation layer 110 to directly contact the bottom electrode 104. In some embodiments, the second metal pad 112b is spaced apart from the piezoelectric layer 106 and/or the top electrode 108 by the passivation layer 110. In some embodiments, the second metal pad 112b is also over the substrate 102. The second metal pad 112b is separated from the first metal pad 112a. In some embodiments, electrical contacts 114 are coupled to each of the first metal pad 112a and the second metal pad 112b. In some embodiments, the electrical contacts 114 are solder bumps.

In some embodiments, the first metal pad 112a and the second metal pad 112b each extend through openings in the passivation layer 110. In some embodiments, a width of the openings in the passivation layer 110 may each be in a range of between about 10 micrometers and about 50 micrometers, about 50 micrometers and about 100 micrometers, about 100 micrometers and about 500 micrometers, about 500 micrometers and about 10 millimeters, and about 10 millimeters and about 100 millimeters. Further, in some embodiments, the passivation layer 110, the top electrode 108, the piezoelectric layer 106, the bottom electrode 104, and the first and second metal pads 112a, 112b may each have a thickness in a range of between about 10 angstroms and about 100 angstroms, about 100 angstroms and about 100 nanometers, about 100 nanometers and about 1 micrometer, about 1 micrometer and about 100 micrometers, and about 100 micrometers and about 1 millimeter.

In some embodiments the bottom electrode 104 and the top electrode 108 may each comprise, for example, stainless steel, brass, copper, galvanized iron, mild steel, lead, monel, nickel, nickel-chromium, zinc, phosphor bronze, aluminum, platinum, gold, ruthenium, copper alloy, graphite, calcium, cesium carbonate, lithium fluoride, molybdenum (IV) oxide, silver, carbon, palladium, tin, steel, scandium, titanium, vanadium, chromium, manganese, cobalt, zinc, gallium, indium, thallium, doped silicon, polysilicon, germanium, antimony, tungsten, hafnium, iridium, mixed metal oxide, titanium nitride, tantalum nitride, or the like. In some embodiments, the bottom electrode 104 comprises the same materials as the top electrode 108, whereas in other embodiments, the bottom electrode 104 may comprise a different material than the top electrode 108. In some embodiments, the piezoelectric layer 106 may comprise, for example, lead zirconate titanate, aluminum nitride, lithium niobate, gallium arsenide, zinc oxide, quartz single crystals, polymer-film piezoelectrics (e.g., PVDF), some other piezoelectric material, or a combination of the foregoing.

Further, in other embodiments of a piezoelectric device, the piezoelectric layer 106 may be disposed between the top and bottom electrodes 108, 104. The piezoelectric layer 160, the bottom electrode 104, and the top electrode 108 may be surrounded by an inter-layer dielectric layer. Further, in such other embodiments, vias may be coupled to the top and bottom electrodes 108, 104 instead of the first and second metal pads 112a, 112b.

In some embodiments, control circuitry 120 may be coupled to the electrical contacts 114 via wires 116. Thus, the control circuitry 120 may be coupled to the bottom electrode 104 and the top electrode 108. The control circuitry 120 is configured to apply voltage biases across the piezoelectric layer 106 via the bottom electrode 104 and the top electrode 108. For example, in some embodiments, the bottom electrode 104 is grounded, and the control circuitry 120 is configured to apply voltages to the top electrode 108.

In some embodiments, the control circuitry 120 is configured to operate the piezoelectric device in a performance mode and a recovery mode. The performance mode involves the control circuitry 120 applying voltage bias pulses across the piezoelectric layer 106 to induce a mechanical strain in the piezoelectric layer 106. During the performance mode, charge carriers may accumulate at a first interface 124 which is between the piezoelectric layer 106 and the bottom electrode 104, or charge carriers may accumulate at a second interface 128 which is between the piezoelectric layer 106 and the top electrode 108. For example, in some embodiments, multiple voltage biases having a same polarity may be applied across the piezoelectric layer 106 by the control circuitry 120. Thus, charge carriers may be continuously biased in a certain direction (e.g., from the bottom electrode 104 to the top electrode 108 or from the top electrode 108 to the bottom electrode 104) depending on the polarity, and charge carriers may accumulate at the first or second interface 124, 128, thereby degrading the piezoelectric device performance. In other embodiments, the piezoelectric device may be stored for a long period of time, and charge carriers may accumulate at one of the first or second interfaces 124, 128, and degrade the piezoelectric device performance.

To improve the piezoelectric device performance, the control circuitry 120 may be configured to operate in a recovery mode by applying a bipolar loop using bipolar voltage biases that are less than or equal to an electric coercive field voltage of the piezoelectric layer 106. In some embodiments, the control circuitry 120 is configured to apply the bipolar loop multiple times to improve the piezoelectric device performance by decreasing charge carrier accumulation at the first or second interface 124, 128.

Figure 2:
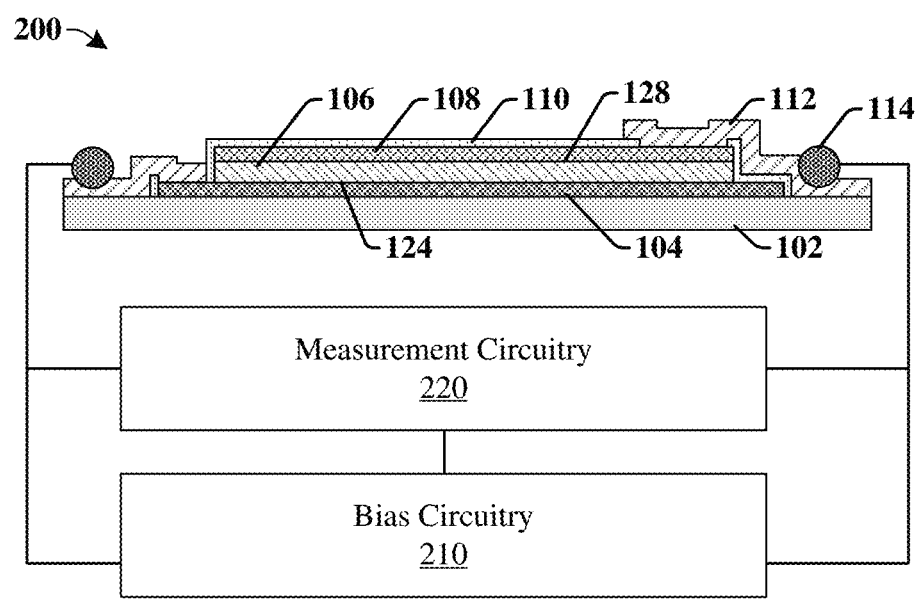
FIG. 2 illustrates a cross-sectional view of some embodiments of a piezoelectric device coupled to bias circuitry and measurement circuitry.

FIG. 2 illustrates a cross-sectional view 200 of some embodiments of a piezoelectric device coupled to measurement circuitry and bias circuitry.

In some embodiments, the control circuitry 120 of FIG. 1 may comprise bias circuitry 210 and measurement circuitry 220. Thus, in some embodiments, measurement circuitry 220 and bias circuitry 210 may be coupled to the top electrode 108 and the bottom electrode 104. Further, in some embodiments, the measurement circuitry 220 may be coupled to the bias circuitry 210. In other embodiments, the measurement circuitry 220 may be directly coupled to the bias circuitry 210, but not directly coupled to the bottom and top electrodes 104, 108 of the piezoelectric device.

In some embodiments, the bias circuitry 210 may be configured to apply voltage biases of varying magnitudes, polarities, and/or time periods across the piezoelectric layer 106 to operate in the performance and the recovery modes. The measurement circuitry 220 may be configured to determine when the bias circuitry 210 is to operate in the recovery mode. In some embodiments, the measurement circuitry 220 is configured to detect that a performance parameter of the piezoelectric device has reached or deviated from a predetermined threshold value. For example, in some embodiments, the performance parameter may be an electrical property of the piezoelectric layer 106, such as, for example, permittivity, capacitance, polarization, or piezoelectric coefficient. In some embodiments, the predetermined threshold value is before imprint has occurred, whereas in other embodiments, the predetermined threshold value is after imprint has occurred. For example, in some embodiments, the predetermined threshold value may define degradation of capacitance. In such embodiments, the capacitance may be considered degraded when the capacitance of the piezoelectric device has deviated from a reference value by more than the predetermined threshold value, such as, for example, 4 percent. In some embodiments, the reference value may be an initial value of the performance parameter of the piezoelectric device. Nevertheless, once the measurement circuitry 220 detects degradation, the measurement circuitry 220 may signal to the bias circuitry 210 to apply the bipolar loop to recover the piezoelectric device.

In other embodiments, the performance parameter of the piezoelectric device may be a predetermined performance time or a predetermined number of performance pulses. For example, in some embodiments, the measurement circuitry 220 may count the time that the bias circuitry 210 has been operating in performance mode. Upon the detection by the measurement circuitry 220 that the time has reached the predetermined performance time, the measurement circuitry 220 may signal to the bias circuitry 210 to apply the bipolar loop to recover the piezoelectric device. For example, in some embodiments, the predetermined performance time may be minutes, hours, days, weeks, etc. Further, in some embodiments, the predetermined number of performance pulses may range from one to thousands of pulses.

In some embodiments, the bias circuitry 210 is configured to apply the bipolar loop multiple times to increase the recovery of the piezoelectric device. In some embodiments, the number of bipolar loops conducted in a recovery operation by the bias circuitry 210 is predetermined. In other embodiments, the measurement circuitry 220 may measure the performance parameter of the piezoelectric device, and detect when the performance parameter has recovered. In some embodiments, recovery of the performance parameter may be based on, for example, a predetermined recovered performance value or a percent improvement between the predetermined threshold value and the performance parameter. In other embodiments, the number of bipolar loops conducted may be based on a predetermined number of loops or a predetermined time period.

Figure 3:
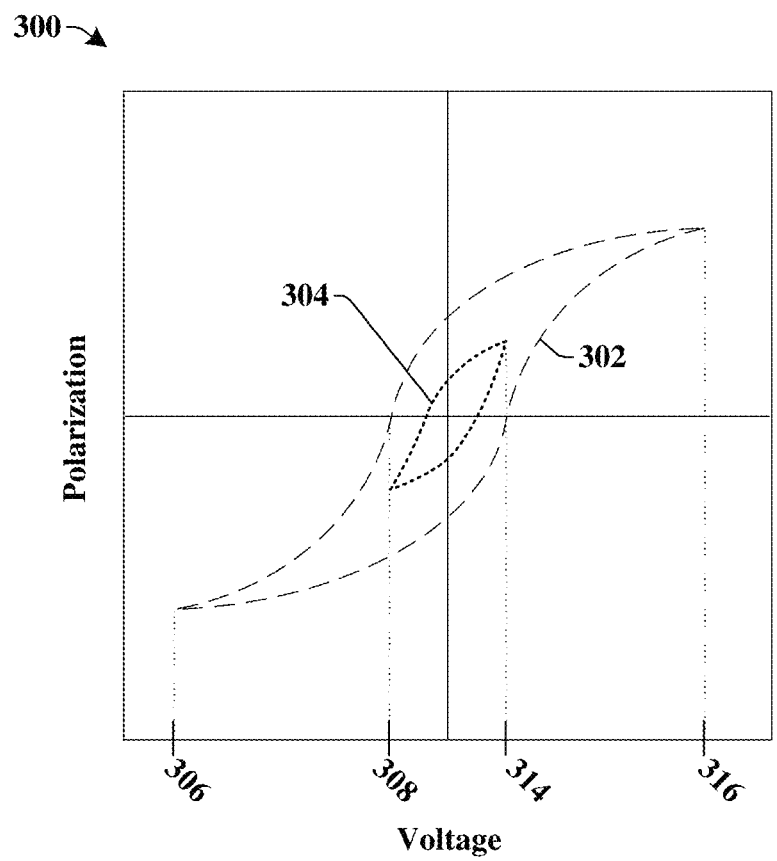
FIG. 3 illustrates a plot of some embodiments of a polarization curve and a bipolar loop within the polarization curve to recover a degraded piezoelectric device.

FIG. 3 illustrates a plot 300 of some embodiments of a bipolar loop in relation to a hysteresis loop of a piezoelectric device.

Plot 300 illustrates polarization versus voltage of a piezoelectric device, such as the piezoelectric device illustrated in FIGS. 1 and 2, for example. An electrical coercive field of a piezoelectric material is the maximum electric field that the piezoelectric material can tolerate before becoming depolarized. The plot 300 in FIG. 3 utilizes a thickness of the piezoelectric layer such that the electrical coercive field may be quantified as an electrical coercive field voltage in a hysteresis loop 302. The hysteresis loop 302 represents the change in polarization of a piezoelectric device as the voltage bias applied to the piezoelectric device is increased from zero volts to a first positive voltage 316, decreased to a first negative voltage 306, and increased back to zero volts, for example. The electrical coercive field voltage of the piezoelectric device is the voltage at which the polarization is equal to zero. In many embodiments, as illustrated in FIG. 3, a piezoelectric device has a positive electric coercive field voltage 314 and a negative electric coercive field voltage 308 determined by the hysteresis loop 302 prior to any imprint effects (e.g., static imprint or dynamic imprint). In some embodiments, the positive electric coercive field voltage 314 and the negative electric coercive field voltage 308 are equal in magnitude. For example, in some embodiments, the positive electric coercive field voltage 314 may be approximately 3 volts, and the negative electric coercive field voltage 308 may be approximately −3 volts.

In some embodiments, a bipolar loop 304 is applied to the piezoelectric device in a recovery operation. The maximum voltage bias and minimum voltage bias of the bipolar loop 304 are determined by the positive electric coercive field voltage 314 and the negative electric coercive field voltage 308, respectively. Thus, in some embodiments, to apply the bipolar loop 304 to a degraded piezoelectric device, the voltage bias applied to the piezoelectric device by the control circuitry (120 of FIG. 1) may, for example, be increased from a start voltage (e.g., zero volts) to the positive electric coercive field voltage 314, decreased to the negative electric coercive field voltage 308, and increased to an end voltage (e.g., zero volts) equal to the start voltage. In other embodiments, the bipolar loop 304 has a maximum voltage that is less than the positive electric coercive field voltage 314 and a minimum voltage that is greater than the negative electric coercive field voltage 308. Thus, the maximum and minimum voltages of the bipolar loop 304 equal to or between the positive electric coercive field voltage 314 and the negative electric coercive field voltage 308 to recover the degraded piezoelectric device while preventing fatigue in the piezoelectric layer 106.

Figure 4:
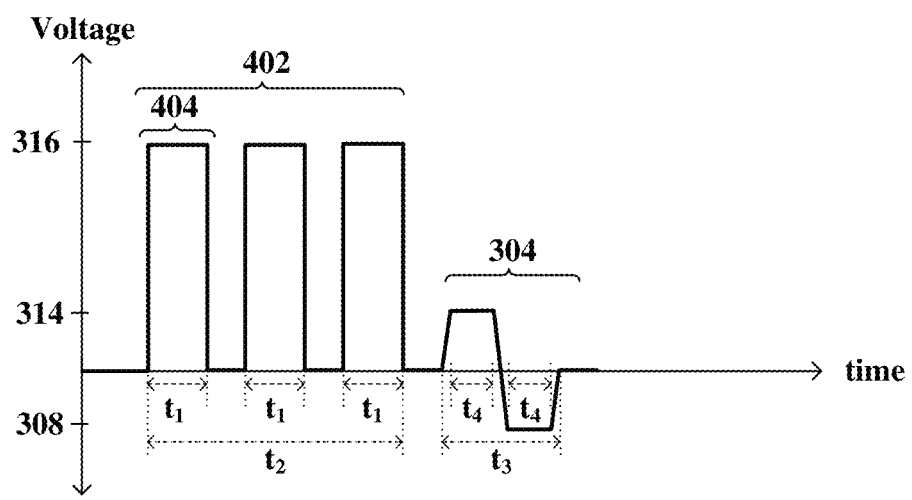
FIGS. 4, 5 and 6 illustrate timing diagrams of some embodiments of voltage versus time for a bipolar loop recovery operation after one or more pulses in a performance operation.

FIG. 4 illustrates a timing diagram 400 of some embodiments where a bipolar loop is applied after consecutive unipolar pulses applied to a piezoelectric device.

In some embodiments, during a performance mode, control circuitry (120 of FIG. 1) may apply multiple unipolar pulses 402. Each pulse 404 of the multiple unipolar pulses 402 may have a first amplitude that is sustained over a first time period $t_1$. In some embodiments, as illustrated in FIG. 4, the first amplitude may be equal to the first positive voltage 316, for example, or in some embodiments, equal to the first negative voltage 306. In other embodiments, the first amplitude may be greater than or less than the first positive voltage 316. In some embodiments, the first positive voltage 316 may be greater than the positive electric coercive field voltage 314, and the first negative field voltage 306 may be less than the negative electric coercive field voltage 308. However, increasing the first amplitude may increase the rate of degradation of performance parameters of the piezoelectric device. Further in some embodiments, each pulse 404 may have the same first amplitudes and/or first time periods $t_1$, whereas in other embodiments, the first amplitude and/or the first time period $t_1$ of each pulse 404 may be different. However, each pulse 404 has a same polarity, which may cause dynamic imprint in a piezoelectric device.

Thus, in some embodiments, after multiple unipolar pulses 402 have been applied to a piezoelectric device over a second time period $t_2$, a recovery operation comprising the bipolar loop 304 may be applied to the piezoelectric device such to recover or prevent the piezoelectric device from the dynamic imprint effect. To conduct the bipolar loop 304, control circuitry (120 of FIG. 1) may increase a voltage bias applied to the piezoelectric device to a second amplitude having a first polarity that is sustained for a fourth time period $t_4$, decrease the voltage bias to a third amplitude having a second polarity that is sustained for the fourth time period $t_4$, and increase the voltage bias from the third amplitude to zero. In some embodiments, the second amplitude equals the third amplitude, and the first polarity is opposite to the second polarity. The first and second amplitudes have magnitudes that are less than or equal to magnitudes of the positive and negative electric coercive field voltages 308, 314 of the piezoelectric device. In FIG. 4, the positive electric coercive field voltage 314 is applied first, and then the negative electric coercive field voltage 308 may be applied. In other embodiments, the negative electric coercive field voltage 308 may be applied first, and then the positive electric coercive field voltage 314 may be applied. Nevertheless, the bipolar loop 304 over a third time period $t_3$ may be applied after multiple unipolar pulses 402 have been applied to a piezoelectric device to recover a piezoelectric device from dynamic imprint effects.

Figure 5:
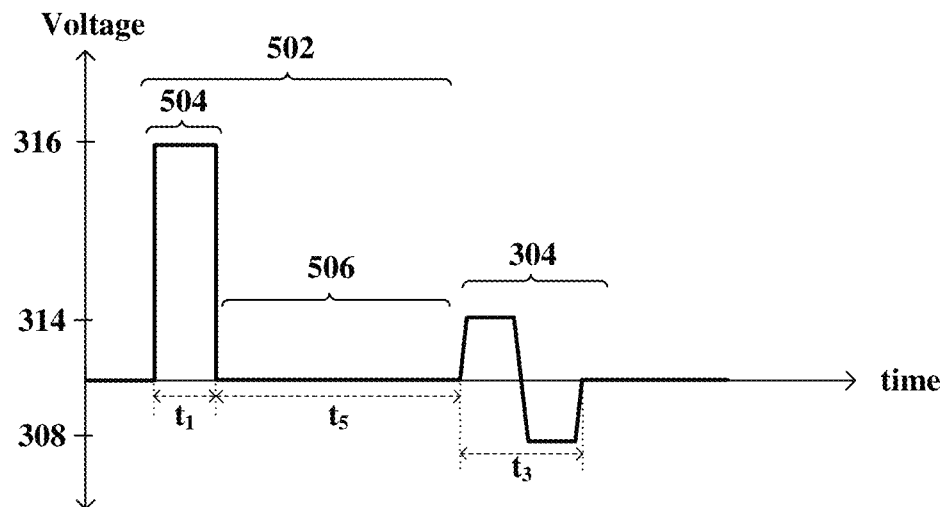

FIG. 5 illustrates a timing diagram 500 of some embodiments where a bipolar loop is applied after a piezoelectric device undergoes a long storage time to recover the piezoelectric device.

In some embodiments, during a performance mode, control circuitry (120 of FIG. 1) may apply a static sequence 502 comprising a pulse 504 followed by a long storage time step 506 to a piezoelectric device. Like each pulse 404 in FIG. 4, in some embodiments, the pulse 504 in FIG. 5 may have a first amplitude that is sustained over the first time period $t_1$. In some embodiments, the first amplitude is equal to the first positive voltage 316, for example, or the first negative voltage 306. In other embodiments, the first amplitude may be greater than or less than the first positive voltage 316, or greater than or less than the first negative voltage 306. After the first time period $t_1$, the control circuitry (120 of FIG. 1) may not apply a voltage bias to the piezoelectric device for a fifth time period $t_5$ during a long storage time step 506. In some embodiments, the fifth time period $t_5$ may be greater than the first time period $t_1$. Nevertheless, in some embodiments the long storage time step 506 (e.g., Q-time) may cause static imprint in a piezoelectric device, thereby degrading properties of the piezoelectric device. In some embodiments, to restore the degraded properties of the piezoelectric device from the static imprint effect, the bipolar loop may be performed over the third time period $t_3$ after the long storage time step 506.

Figure 6:
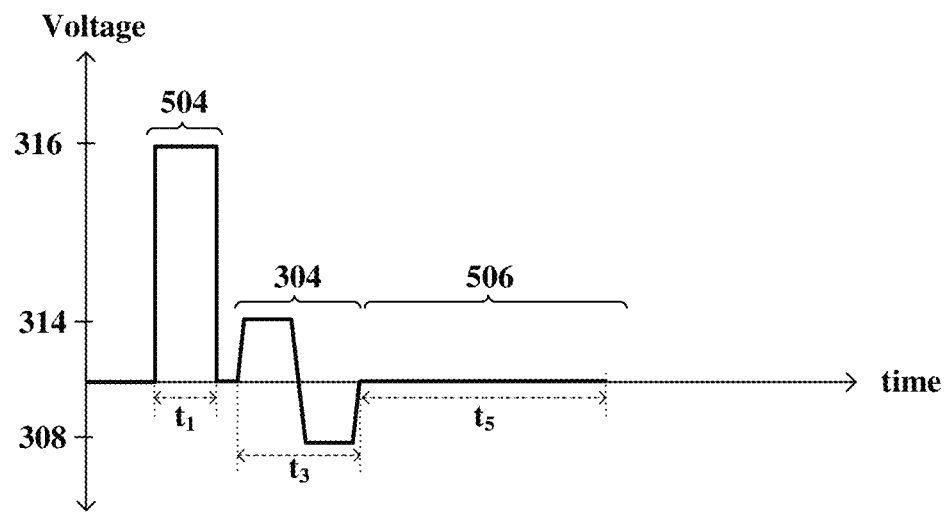

FIG. 6 illustrates a timing diagram 600 of some embodiments where a bipolar loop is applied before a piezoelectric device undergoes a long storage time to prevent degradation in a piezoelectric device.

The timing diagram 600 of FIG. 6 comprises the same pulse 504, bipolar loop 304, and long storage time step 506 as in the timing diagram 500 of FIG. 5, except that in FIG. 6, the bipolar loop 304 is conducted before the long storage time step 506. In some embodiments, the bipolar loop 304 is conducted before the long storage time step 506 to prevent the static imprint effect from occurring in a piezoelectric device by reducing the polarization and therefore charge accumulation at a first or second interface (e.g., 124, 128) of the piezoelectric device during the long storage time step 506.

Figure 7A:
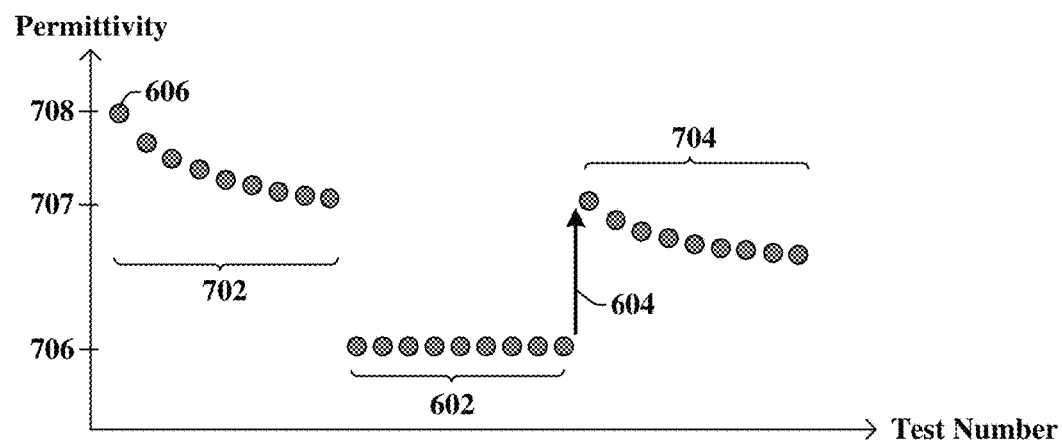
FIG. 7A illustrates of a plot of some embodiments of recovery of permittivity of a piezoelectric structure after an imprint effect due to multiple performance operation cycles.

FIG. 7A illustrates a plot 700A of some embodiments of degradation, imprint, and recovery of permittivity of a piezoelectric device.

The plot 700A in FIG. 7A comprises multiple permittivity data points 606 for each "test number." In some embodiments, a test may comprise multiple unipolar pulses (402 of FIG. 4), a static sequence (502 of FIG. 5), or a combination thereof. For example, in some embodiments, a test may comprise multiple unipolar pulses (402 of FIG. 4) followed by a long storage time step 506. After each test, the permittivity or some other performance parameter of a piezoelectric device may be measured at zero volts and recorded on the plot 700A as a permittivity data point 606. A first group 702 of the permittivity data points 606 illustrates how over time, the permittivity of a piezoelectric device decreases. However, between the first group 702 and a second group 602, the permittivity of a piezoelectric device significantly decreases to an imprinted permittivity 706, and remains constant throughout the permittivity data points 606 of the second group 602. Thus, an imprint effect (e.g., static imprint or dynamic imprint) may have occurred between the last test of the first group 702 and a first test of the second group 602.

In some embodiments, at the end of the second group 602, a recovery operation 604 comprising bipolar loops (e.g., 304 of FIG. 4) may increase the permittivity of the piezoelectric device. Although the recovery operation 604 may not fully recover the permittivity of the piezoelectric device to an initial permittivity 708, the recovery operation 604 may increase the permittivity of the piezoelectric device from the imprinted permittivity 706 to a recovered permittivity 707. In some embodiments, the imprinted permittivity 706 is ten percent lower than the initial permittivity 708. Thus, although the permittivity data points 606 may not be as high in a third group after the recovery operation 604 than the permittivity data points 606 in the first group 702, the recovery operation 604 still improves performance parameters of the piezoelectric device after imprint effects.

Figure 7B:
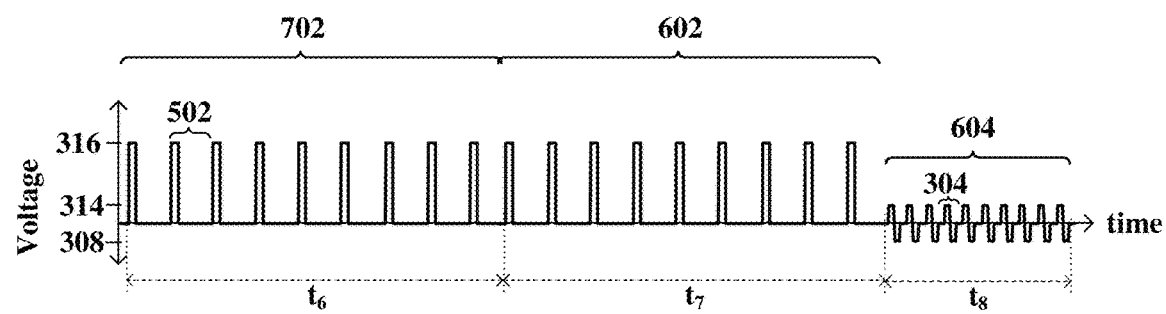
FIGS. 7B and 7C illustrate timing diagrams of some embodiments of performance operations and bipolar loops that may correspond to the plot of FIG. 7A.

FIG. 7B illustrates a timing diagram 700B of some embodiments of performing a bipolar loop to recover a piezoelectric device after static imprint.

The timing diagram 700B of FIG. 7B may correspond to the plot 700A of FIG. 7A. For example, in some embodiments, each permittivity data point 606 of FIG. 7A may represent the measured permittivity of a piezoelectric device after each static sequence 502. Thus, in the first group 702 of FIG. 7A, there are nine permittivity data points 606, and in the first group 702 of FIG. 7B, there are nine static sequences 502. In some embodiments, the first group 702 of static sequences 502 may occur over a sixth time period $t_6$, and the second group 602 of static sequences 502 may occur over a seventh time period $t_7$. Between the first and second groups 702, 602, a static imprint effect may occur. To recover the piezoelectric device from the static imprint effect, the recovery operation 604 may comprise more than one bipolar loop 304. For example, as illustrated in FIG. 7B, ten bipolar loops 304 are conducted over an eighth time period $t_8$ in the recovery operation 604. In other embodiments, a total number of bipolar loops 304 in a recovery operation 604 may be in a range of between approximately one bipolar loop 304 and approximately 100 bipolar loops 304.

In some embodiments, a total number of bipolar loops 304 conducted in a recovery operation 604 is dependent how much time can be spared, how much recovery is desired, and/or the amount of power available, for example. In some embodiments, each bipolar loop 304 occurs over the third time period $t_3$ that is equal to approximately 40 milliseconds, for example. In some embodiments, the bipolar loops 304 continue until measurement circuitry (220 of FIG. 2) determines that a predetermined recovered performance value has been reached, or a percent improvement between the predetermined threshold value and the performance parameter has been reached. The predetermined recovered performance value may be based on a measurement of a performance parameter of the piezoelectric device, the eighth time period $t_8$, or a number of bipolar loops, for example. Thus, by using one or more bipolar loops 304 in a recovery operation 604, properties of a degraded piezoelectric device due to an imprint effect may be improved.

Figure 7C:
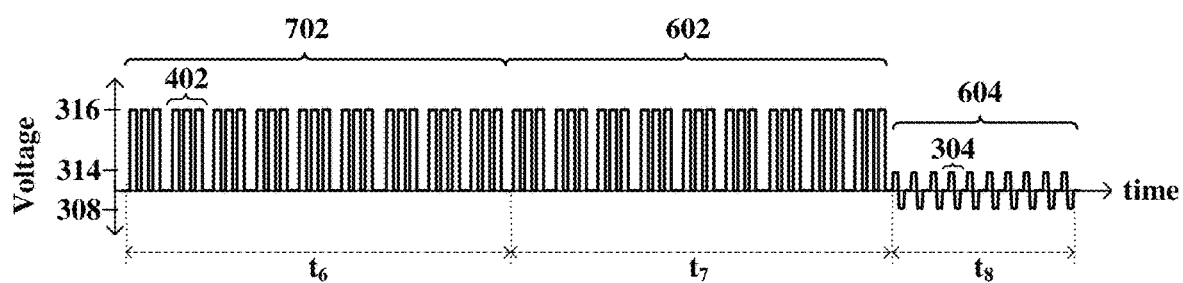

FIG. 7C illustrates a timing diagram 700C of some embodiments of performing a bipolar loop to recover a piezoelectric device after dynamic imprint.

The timing diagram 700C of FIG. 7C may correspond to the plot 700A of FIG. 7A. For example, in some embodiments, each permittivity data point 606 of FIG. 7A may represent the measured permittivity of a piezoelectric device after each set of multiple unipolar pulses 402. In some embodiments, each set of multiple unipolar pulses 402 may comprise three pulses (404 of FIG. 4), whereas in other embodiments, each set of multiple unipolar pulses 402 may comprise more than or less than three pulses (404 of FIG. 4). In the first group 702 of FIG. 7A, there are nine permittivity data points 606, and in the first group 702 of FIG. 7C, there are nine sets of multiple unipolar pulses 402. Between the first and second groups 702, 602, a dynamic imprint effect may occur. To recover the piezoelectric device from the dynamic imprint effect, the recovery operation 604 may comprise more than one bipolar loop 304.

Figure 8A:
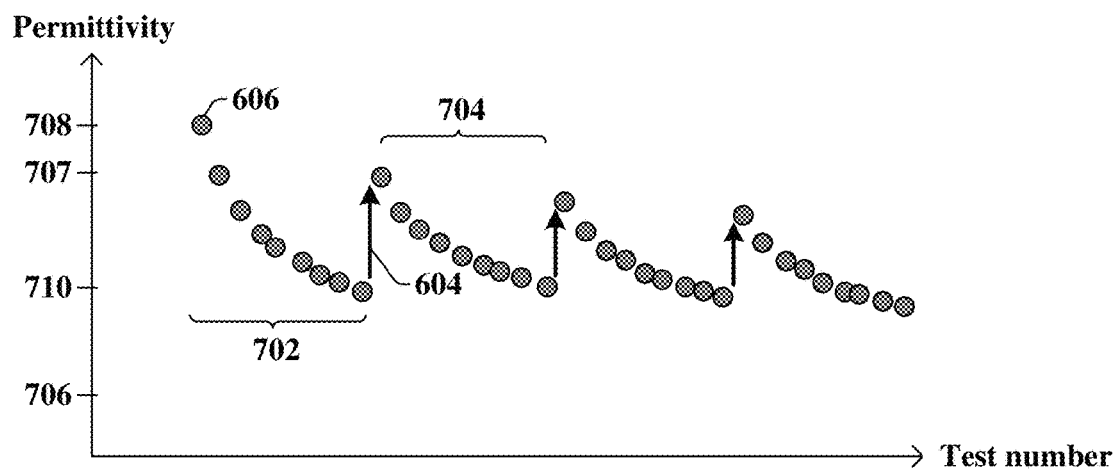
FIG. 8A illustrates a plot of some embodiments of recovery of permittivity of a piezoelectric structure to prevent an imprint effect.

FIG. 8A illustrates a plot 800A of some embodiments of recovery of permittivity of a piezoelectric device prior to imprint effects.

The plot 800A of FIG. 8A illustrates how the recovery operation 604 may be applied after the first group 702 but before the second group (602 of FIG. 7A) such that the piezoelectric device may recover before an imprint effect (e.g., static imprint or dynamic imprint) occurs. Although the imprint effect has not fully occurred, as shown in the second group (602 of FIG. 7A), the permittivity of the piezoelectric device may still degrade. In some embodiments, by preventing the imprint effect, the recovery operation 604 may be more effective in improving degraded device performance of a piezoelectric device.

In some embodiments, the recovery operation 604 may be applied to a piezoelectric device because the intermediate permittivity 710 or some other performance parameter of the piezoelectric device has reached a performance parameter predetermined threshold value. In other embodiments, the recovery operation 604 may be applied to the piezoelectric device because the intermediate permittivity 710 of the piezoelectric device has deviated from the initial permittivity 708 (e.g., reference value) by more than a performance parameter predetermined threshold value. In some embodiments, the measurement and determination of device degradation may be performed by measurement circuitry (220 of FIG. 2). In yet other embodiments, when a total number of pulses or a time period has reached a predetermined threshold value while the piezoelectric device is in performance mode during the first group 702, the recovery operation 604 may be conducted to prevent the imprint effect (e.g., static imprint or dynamic imprint).

Figure 8B:
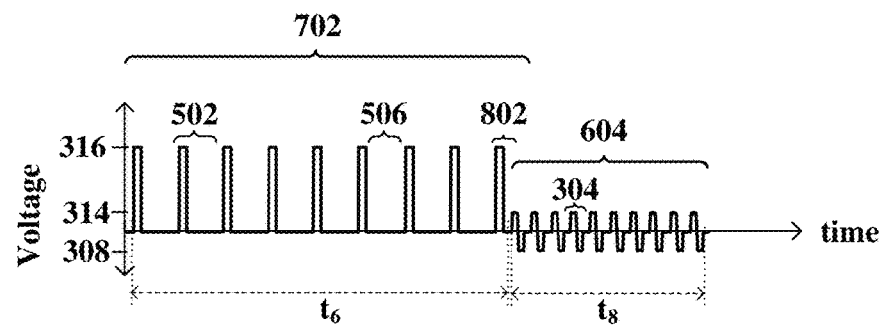
FIGS. 8B and 8C illustrate timing diagrams of some embodiments of performance operations and bipolar loops that may correspond to the plot of FIG. 8A.

FIG. 8B illustrates a timing diagram 800B of some embodiments of performing a bipolar loop prior to degradation of a piezoelectric device via static imprint.

The timing diagram 800B of FIG. 8B may correspond to the plot 800A of FIG. 8A. For example, in some embodiments, each permittivity data point 606 of FIG. 8A may represent the measured permittivity of a piezoelectric device after each static sequence 502. Thus, in the first group 702 of FIG. 8A, there are nine permittivity data points 606, and in the first group 702 of FIG. 8B, there are nine static sequences 502. However, a last one 802 of the static sequences 502 may not comprise the long storage time step 506.

In some embodiments, because the recovery operation 604 is conducted before the static imprint effect, less bipolar loops 304 may be used in the recovery operation 604 than if the recovery operation 604 was performed after the static imprint effect (e.g., FIG. 7B). In embodiments, to better improve the piezoelectric device, a same or a higher number of bipolar loops 304 may be used in the recovery operation 604 when conducted before the static imprint effect than the number of bipolar loops 304 conducted after a static imprint effect.

Figure 8C:
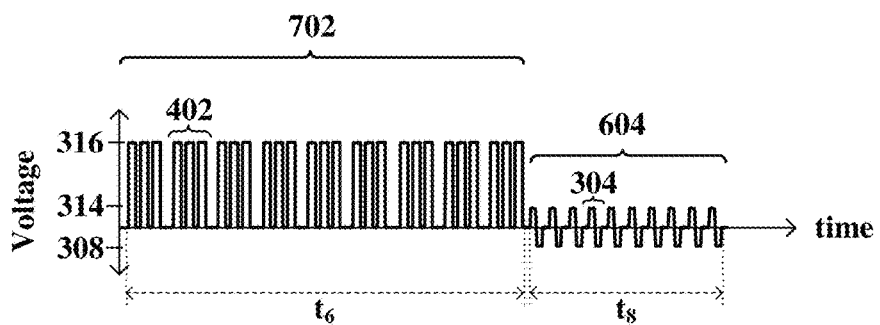

FIG. 8C illustrates a timing diagram 700B of some embodiments of performing a bipolar prior to degradation of a piezoelectric device via dynamic imprint.

The timing diagram 800C of FIG. 8C may correspond to the plot 800A of FIG. 8A. For example, in some embodiments, each permittivity data point 606 of FIG. 8A may represent the measured permittivity of a piezoelectric device after each set of multiple unipolar pulses 402. Thus, in the first group 702 of FIG. 8A, there are nine permittivity data points 606, and in the first group 702 of FIG. 8B, there are nine sets of multiple unipolar pulses 402. In some embodiments, to prevent dynamic imprint from occurring and to improve any performance parameters of the degraded piezoelectric device, the recovery operation 604 may be conducted after the first group 702.

Figure 9:
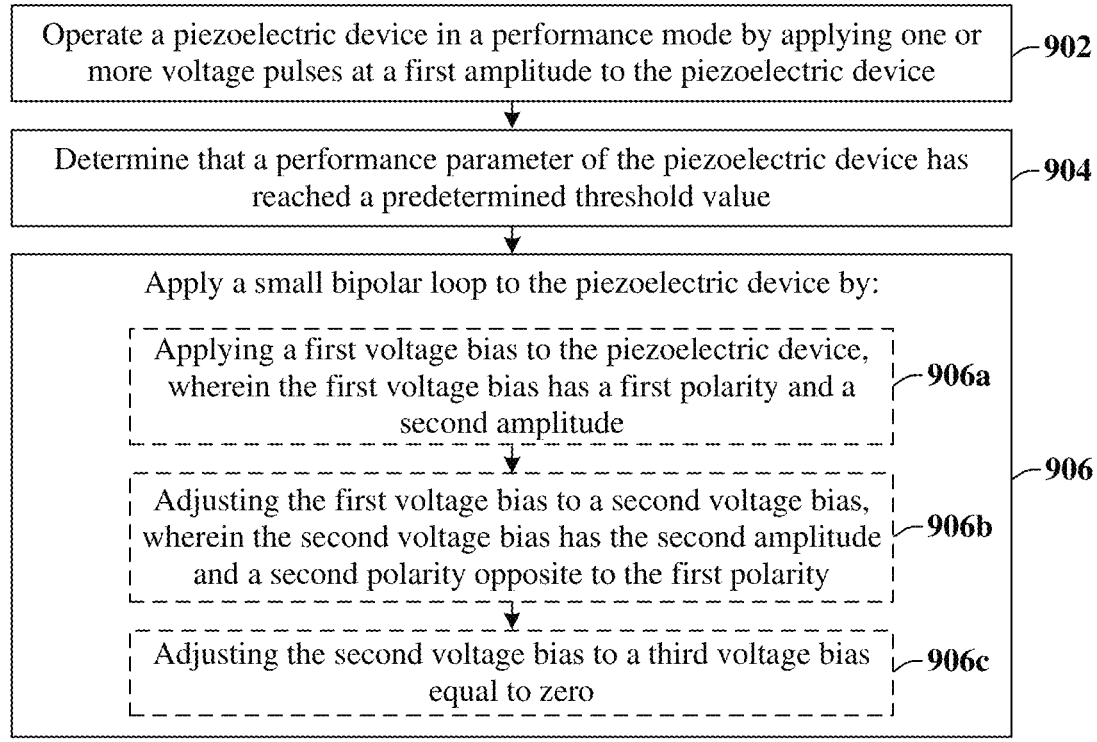
FIG. 9 illustrates a flow diagram of some embodiments of a method of performing a bipolar loop after a performance parameter of a piezoelectric device has degraded.

FIG. 9 illustrates a flow diagram of some embodiments of a method 900 of performing a bipolar loop to a piezoelectric device upon detection of a performance parameter reaching a predetermined threshold value.

While method 900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 902, a piezoelectric device is operated in performance mode by applying one or more voltage pulses at a first amplitude to the piezoelectric device. FIG. 4 illustrates a timing diagram 400 of some embodiments corresponding to act 902.

At act 904, a determination that a performance parameter of the piezoelectric device has reached a predetermined threshold value is performed.

At act 906, a bipolar loop is applied to the piezoelectric device by performing acts 906a, 906b, and 906c.

At act 906a, a first voltage bias is applied to the piezoelectric device, wherein the first voltage bias has a first polarity and a second amplitude.

At act 906b, the first voltage bias is adjusted to a second voltage bias, wherein the second voltage bias has the second amplitude and a second polarity opposite to the first polarity.

At act 906c, the second voltage bias is adjusted to a third voltage bias equal to zero. FIGS. 8A, 8B, and 8C illustrate a plot 800A, a timing diagram 800B, and a timing diagram 800C, respectively, of some embodiments corresponding to acts 904, 906, 906a, 906b, and 906c.

Therefore, the present disclosure relates to a method of performing a bipolar loop to a piezoelectric device to prevent an imprint effect or recover after an imprint effect to reduce degradation and increase reliability of a piezoelectric device.

Accordingly, in some embodiments, the present disclosure relates to a method for recovering degraded device performance of a piezoelectric device, the method comprising: operating the piezoelectric device in a performance mode over a first time period by applying one or more voltage pulses greater than or equal to a first amplitude to the piezoelectric device; determining during the first time period that a performance parameter of the piezoelectric device has a first value that has deviated from a reference value by more than a predetermined threshold value; applying a bipolar loop to the piezoelectric device over a second time period comprising positive and negative voltage biases, the second time period being after the first time period; and operating the piezoelectric device in the performance mode over a third time period after the second time period, wherein the performance parameter of the piezoelectric device has a second value during the third time period, and wherein an absolute difference between the second value and the reference value is less than an absolute difference between the first value and the reference value.

In other embodiments, the present disclosure relates to a method for preventing degraded device performance of a piezoelectric device, the method comprising: operating the piezoelectric device in a performance mode over a first time period by applying one or more voltage pulses greater than or equal to a first amplitude to the piezoelectric device, wherein the first amplitude is greater than an electric coercive field voltage of the piezoelectric device; determining that a predetermined threshold value of the performance mode has been reached; and performing a bipolar loop to the piezoelectric device over a second time period by: applying a voltage bias signal across the piezoelectric device at a second amplitude at a first polarity; adjusting the voltage bias signal across the piezoelectric device from the second amplitude to a third amplitude at a second polarity opposite to the first polarity, wherein the second amplitude is equal to the third amplitude, and wherein the second amplitude is less than or equal to the electric coercive field voltage of the piezoelectric device; and adjusting the voltage bias signal across the piezoelectric device from the third amplitude to a fourth amplitude that is between the second amplitude and the third amplitude.

In yet other embodiments, the present disclosure relates to a system, the system comprising: a piezoelectric device disposed on a semiconductor substrate, the piezoelectric device comprising a piezoelectric structure disposed between a first electrode and a second electrode; bias circuitry electrically coupled to the first electrode and the second electrode, wherein the bias circuitry configured to operate in a performance mode by applying a voltage bias across the piezoelectric structure; measurement circuitry electrically coupled to the bias circuitry, wherein the measurement circuitry is configured to detect that a predetermined threshold value has been reached during the performance mode; and wherein the bias circuitry is configured to perform a recovery operation upon detection of the predetermined threshold value by: increasing the voltage bias from a start value to a first magnitude at a first polarity, decreasing the voltage bias from the first magnitude at the first polarity to the first magnitude at a second polarity opposite to the first polarity, and increasing the voltage bias from the first magnitude at the second polarity to an end value equal to the start value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
applying a first set of one or more voltage pulses to a piezoelectric device over a first time period;
during the first time period, determining whether a performance parameter of the piezoelectric device has a first value that deviates from a reference value by more than a predetermined value; and
based on whether the first value deviates from the reference value by more than the predetermined value, selectively applying a second set of one or more voltage pulses to the piezoelectric device over a second time period, the second time period being after the first time period and second set of one or more voltage pulses differing in magnitude and/or polarity from the first set of one or more voltage pulses.

2. The method of claim 1, further comprising:
re-applying the first set of one or more voltage pulses to the piezoelectric device during a third time period after the second time period; and
wherein the performance parameter of the piezoelectric device has a second value during the third time period, and wherein a second difference between the second value and the reference value is less than a first difference between the first value and the reference value.

3. The method of claim 1, wherein the performance parameter is a permittivity of the piezoelectric device.

4. The method of claim 1, wherein selectively applying the second set of one or more voltage pulses comprises:
applying a first voltage bias to the piezoelectric device, wherein the first voltage bias has a first polarity;
applying a second voltage bias to the piezoelectric device after the first voltage bias has been applied, wherein the second voltage bias has a second polarity opposite the first polarity.

5. The method of claim 4, wherein selectively applying the second set of one or more voltage pulses further comprises:
applying a third voltage bias to the piezoelectric device after the first voltage bias has been applied and before the second voltage bias is applied, wherein the third voltage bias is between the first voltage bias and the second voltage bias.

6. The method of claim 5, wherein the first voltage bias has a first amplitude and the second voltage bias has a second amplitude, the second amplitude is less than the first amplitude.

7. The method of claim 6, wherein the second amplitude is less than or equal to an electric coercive field voltage of the piezoelectric device, and wherein the first amplitude is greater than the electric coercive field voltage.

8. The method of claim 5, wherein the third voltage bias is zero.

9. A system, comprising:
a piezoelectric device disposed on a semiconductor substrate, the piezoelectric device comprising a piezoelectric structure disposed between a first electrode and a second electrode;
bias circuitry electrically coupled to the first electrode and the second electrode, wherein the bias circuitry is configured to apply a first set of one or more voltage pulses to the piezoelectric device over a first time period;
measurement circuitry electrically coupled to the bias circuitry, wherein the measurement circuitry is configured to detect that a performance parameter of the piezoelectric device has a first value that exhibits a deviation from a reference value by more than a predetermined threshold value after application of the first set of one or more voltage pulses.

10. The system of claim 9, wherein the bias circuitry is configured to, based on detection of the deviation, perform a recovery operation by selectively applying a second set of one or more voltage pulses to the piezoelectric device over a second time period, the second time period being after the first time period and second set of one or more voltage pulses differing in magnitude and/or polarity from the first set of one or more voltage pulses.

11. The system of claim 10, wherein the bias circuitry is further configured to re-apply the first set of one or more voltage pulses to the piezoelectric device during a third time period after the second time period.

12. The system of claim 11, wherein the performance parameter of the piezoelectric device has a second value during the third time period, and wherein a second absolute difference between the second value and the reference value is less than a first absolute difference between the first value and the reference value.

13. The system of claim 9, wherein the measurement circuitry is configured to count a number of voltage bias pulses applied by the bias circuitry, and wherein the predetermined threshold value is a predetermined number of voltage bias pulses counted by the measurement circuitry.

14. The system of claim 13, wherein the measurement circuitry is configured to measure a total time that the bias circuitry is in a performance mode, and wherein the predetermined threshold value is a predetermined time measured by the measurement circuitry.

15. The system of claim 14, wherein the total time is at least an hour.

16. The system of claim 9, wherein a first magnitude of the first set of one or more voltage pulses is less than or equal to an electric coercive field voltage of the piezoelectric structure.

17. A system, comprising:
a piezoelectric structure disposed between a first electrode and a second electrode;
bias circuitry electrically coupled to the first electrode and the second electrode, wherein the bias circuitry is configured to apply a first set of one or more voltage pulses to the piezoelectric structure over a first time period;
measurement circuitry electrically coupled to the bias circuitry, wherein the measurement circuitry is configured to determine whether the piezoelectric structure has a first permittivity that exhibits a deviation from a reference permittivity by more than a predetermined value; and
wherein, upon detection of the deviation, the bias circuitry is configured to perform a recovery operation by selectively applying a second set of one or more voltage pulses to the piezoelectric structure over a second time period, the second time period being after the first time period and second set of one or more voltage pulses differing in magnitude and/or polarity from the first set of one or more voltage pulses.

18. The system of claim 17, wherein the bias circuitry is further configured to re-apply the first set of one or more voltage pulses to the piezoelectric structure during a third time period after the second time period.

19. The system of claim 18, wherein the piezoelectric structure has a second permittivity during the third time period, and wherein a second absolute difference between the second permittivity and the reference permittivity is less than a first absolute difference between the first permittivity and the reference permittivity.

20. The system of claim 17, wherein the piezoelectric structure is arranged on a semiconductor substrate.

* * * * *